United States Patent
Yanagisawa

(10) Patent No.: US 9,889,473 B2
(45) Date of Patent: Feb. 13, 2018

(54) APPARATUS FOR CLEANING END SURFACES OF SUBSTRATE

(71) Applicant: NAGAOKA SEISAKUSHO CORP., Nagano (JP)

(72) Inventor: Soichi Yanagisawa, Nagano (JP)

(73) Assignee: Nagaoka Seisakucho Corp. (JP)

( * ) Notice: Subject to any disclaimer, the term of this patent is extended or adjusted under 35 U.S.C. 154(b) by 21 days.

(21) Appl. No.: 14/954,392

(22) Filed: Nov. 30, 2015

(65) Prior Publication Data
US 2017/0151586 A1    Jun. 1, 2017

(51) Int. Cl.
| | |
|---|---|
| B08B 1/02 | (2006.01) |
| B08B 1/00 | (2006.01) |
| B08B 5/04 | (2006.01) |
| A46B 13/00 | (2006.01) |
| B08B 15/04 | (2006.01) |
| H01L 21/67 | (2006.01) |
| H05K 3/00 | (2006.01) |

(52) U.S. Cl.
CPC ............... B08B 1/02 (2013.01); A46B 13/00 (2013.01); B08B 1/002 (2013.01); B08B 15/04 (2013.01); H01L 21/67046 (2013.01); H05K 3/00 (2013.01)

(58) Field of Classification Search
CPC ......... B08B 11/02; B08B 1/002; B08B 5/043; B08B 5/044; B08B 5/04; G03D 15/02; G03D 15/00; G11B 23/502
See application file for complete search history.

(56) References Cited

U.S. PATENT DOCUMENTS 5,901,400 A * 5/1999 Fulop ................. B08B 1/02
15/88
2006/0236476 A1* 10/2006 Gau .................. B08B 1/02
15/56

FOREIGN PATENT DOCUMENTS

| JP | H-1058293 A | 3/1998 |
|---|---|---|
| JP | 2007-030051 A | 2/2007 |
| JP | 2009-233547 A | 10/2009 |
| JP | 2010-207687 A | 9/2010 |
| JP | 5651226 B1 | 1/2015 |

* cited by examiner

*Primary Examiner* — Dung Van Nguyen
(74) *Attorney, Agent, or Firm* — Blank Rome LLP

(57) ABSTRACT

An apparatus that cleans end surfaces of a substrate includes: a guide unit including a guide portion that has a channel, through which an end surface of a substrate passes, formed in a front surface thereof; and a brush with a front end whose position is controlled by a rear surface of the guide portion. The channel includes an opening that extends through the guide portion and the front end of the brush contacts an end surface of a substrate passing through the channel via the opening. The guide unit includes a concave portion in which at least the front end of the brush is housed and a suction hole that sucks dust from the concave portion.

9 Claims, 7 Drawing Sheets

APPARATUS FOR CLEANING END SURFACES OF SUBSTRATE

TECHNICAL FIELD

The present invention relates to an apparatus for cleaning the end surfaces of a substrate.

BACKGROUND ART

Japanese Laid-Open Patent Publication No. 2010-207687 discloses the provision of an apparatus capable of carrying out an operation that removes dust from both main surfaces of a substrate in a shorter time than in the past. The apparatus in the cited document includes a conveying means that conveys a substrate (board) and a pair of rotating brush rollers that are disposed above and below so as to sandwich a substrate conveyed by the conveying means and that respectively extend in a direction that is crosswise to the conveying direction of the substrate. The conveying means includes a first conveyor for conveying a substrate that is disposed upstream of the pair of rotating brush rollers and a second conveyor for conveying the substrate that is disposed downstream of the pair of rotating brush rollers. The first conveyor and the second conveyor are disposed at an interval that enables the pair of rotating brush rollers to contact the substrate.

DISCLOSURE OF THE INVENTION

The apparatus disclosed in the cited document is suited to cleaning the front and back main surfaces of a substrate. However, there is also demand for an apparatus that cleans the end surfaces to the main surfaces of a substrate.

One aspect of the present invention is an apparatus including: a guide unit including a guide portion that has a channel, through which an end surface of a substrate (circuit board) passes, formed in a front surface thereof; and a brush with a front end whose position is controlled by the front end contacting a rear surface of the guide portion, wherein the channel includes an opening that extends through the guide portion and the front end of the brush contacts an end surface of a substrate passing through the channel via the opening. Via the opening provided in the channel, it is possible to clean the end surface of the substrate that passes through the channel with the brush, for which the position of the front end is controlled by the rear surface of the guide portion. Accordingly, in this apparatus, it is possible to remove unwanted matter such as dust from the end surface of the substrate while the end surface of the substrate passes through and is supported by the channel in a state where the brush has little effect on circuits and circuit components mounted on the front surface or back surface of the substrate.

It is desirable for the guide unit to include: a concave portion in which at least the front end of the brush is housed; and a suction hole that sucks dust from the concave portion. The concave portion suppresses dispersion of dust that has been removed by the brush, and it is possible to collect or remove dust from the suction hole.

The guide unit should preferably also include a channel that connects to the suction hole on a rear surface of the guide portion inside the concave portion. It is possible to collect or remove dust and the like that adheres to the front end of the brush from the suction hole via the channel on the back surface. This means that it is possible to suppress reattachment of dust to the substrate.

The brush may be a rotating brush or a brush that moves forward and backward, up and down, and/or left and right. The rotational shaft may be parallel with the rear surface of the guide portion. Since a brush with a rotational axis that is perpendicular to the rear surface of the guide portion contacts the end surface of a substrate that passes the channel of the guide portion in different directions in the up-down direction, it is possible to efficiently clean the end surface of a substrate. With a brush whose rotational axis is parallel to the rear surface or the front surface of the guide portion, it is possible to control the position of the front end of the brush by controlling the position of the rotational axis. On the other hand, with a brush whose rotational axis is perpendicular to the rear surface of the guide portion, it is not possible to control the position of the rotational axis and difficult to control the position of the front end of the brush. In this apparatus, it is possible to control the position of the front end of the brush by contacting or pressing itself against the rear surface of the guide portion. Even when the front end of the brush abrades as the cleaning progresses, the position of the front end of the brush can be controlled itself with the rear surface of the guide portion as a standard. This means that it is possible to cause the front end of the brush to stably contact the end surface of the substrate that passes through the channel of the guide portion, thereby obtaining a stabilized cleaning effect.

It is desirable for the guide unit to include a support portion that protrudes in a direction of the rotational axis from the back surface (rear surface) of the channel of the guide portion through which an end portion of substrate (board) passes, wherein the brush rotates around the rotational axis in a state where the support portion is inserted into a depressed part in a center part on a front end side of the brush. It is possible to control the position of the rotating brush even more stably. A typical example of a rotating brush is a rotating circular type brush.

It is desirable for the cleaning apparatus to further include: a unit that presses the brush toward a rear surface of the guide portion; and a unit that fixes a position of the brush in a state where the front end of the brush is away from the rear surface of the guide portion. When it is necessary to clean the end surface of a substrate, it is possible to control the position of the front end of the brush using the rear surface of the guide portion by pressing the brush toward the rear surface of the guide portion. Alternatively, when it is not necessary to clean the end surface of a substrate, it is possible to withdraw the brush using the unit that fixes to a state where the brush does not contact the end surface of the substrate.

It is possible for the cleaning apparatus to include: a plurality of the guide units disposed so that the channels in the surfaces face one another at a position where a pair of end surfaces of the substrate pass the channels respectively; and a plurality of brushes disposed so that positions of the front ends are controlled by the rear surfaces of the guide portions of the plurality of guide units respectively. In addition, it is desirable for the cleaning apparatus to include a unit that conveys the substrate so that the pair of ends of the substrate pass through the channels in the front surfaces of the guide portions of the plurality of guide units. It is possible to clean both ends at the same time while conveying a substrate.

DETAIL DESCRIPTION

Figure 1:
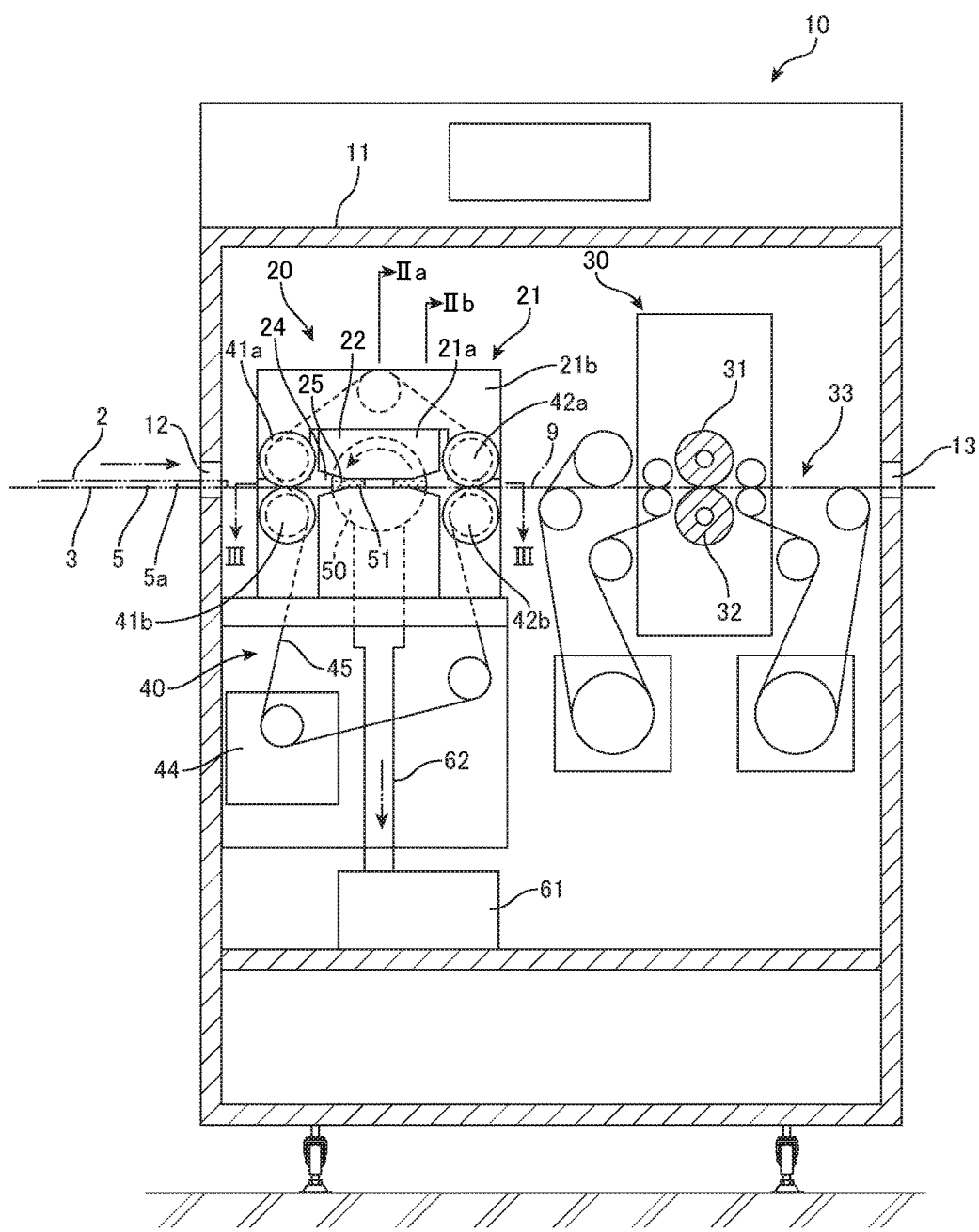
FIG. 1 shows the overall configuration of a substrate cleaning apparatus.

FIG. 1 shows the overall configuration of a substrate cleaning apparatus 10. This substrate cleaning apparatus 10 is an apparatus capable of being installed midway on a line that conveys substrates 5 and is capable of cleaning two faces (both main surfaces) such as front and back, and both end surfaces (a pair of end surfaces) of a substrate (such as printed circuit board) 5 that is being conveyed. The substrate cleaning apparatus 10 includes a housing 11, an end surface cleaning apparatus 20, and a two-face (two-sided) cleaning apparatus 30, the cleaning apparatus 20 and 30 are disposed inside the housing 11. The substrate 5 passes the end surface cleaning apparatus 20 and the two-face cleaning apparatus 30 from an input port 12 of the housing 11 and is discharged from an output port 13. The two-face cleaning apparatus 30 includes cleaning rollers 31 and 32 for cleaning a front surface 2 and a lower surface (back surface) 3 of the substrate 5 and a conveyor 33 that conveys the substrate 5.

The end surface cleaning apparatus (or "end surface cleaner") 20 includes guide blocks (or "guide units") 21 that support and guide a vicinity of a pair of the end surfaces 5a of the substrate 5 respectively and a conveyor unit 40 that acts as a guide so that the end surfaces 5a move along the guide blocks 21. Each guide block 21 has a channel 24 that allows the end surface 5a of the substrate 5 to pass through formed in a front surface (surface) 22 thereof. The end surface cleaning apparatus 20 further includes a brush 50 with front ends 51 whose position is controlled by the guide block 21. The channel 24 includes openings 25 that extend through the guide block 21, with the front ends 51 of the brush 50 passing through the openings 25 and contacting the end surface 5a of the substrate 5 in the channel 24 so as to clean the end surface (edge face, end face, or end section) 5a.

The conveyor unit 40 includes rollers 41a and 41b and 42a and 42b that sandwich and move the ends of the substrate 5 from above and below at positions before and after the channel 24, a motor 44 that drives the rollers 41a to 42b, and a driving belt 45. There are various possibilities for the position of the motor 44 and the arrangement of the driving belt 45, and such position and arrangement are not limited to those in the present embodiment. The guide block 21 includes a lower block 21a, which includes the lower rollers 41b and 42b and the channel 24, and an upper block 21b, which supports the upper rollers 41a and 42a.

The end surface cleaning apparatus 20 further includes a pump (vacuum pump) 61, which uses suction to remove dust that has been removed from the substrate 5 by the brush 50 from the guide block 21, and a suction hose 62.

Figure 2:
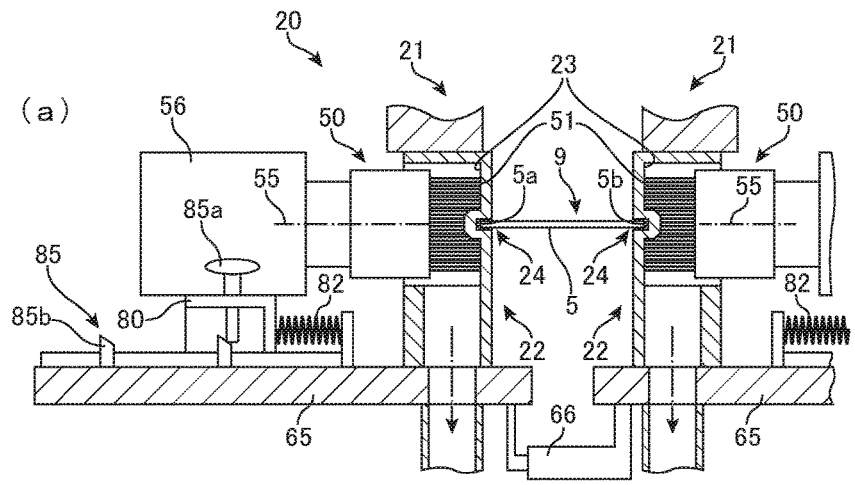
FIGS. 2(a)-(c) are cross-sectional views showing the configuration of a vicinity of a guide block and a brush of the substrate cleaning apparatus in enlargement, with FIG. 2(a) a cross-sectional view in a direction IIa in FIG. 1, FIG. 2(b) a cross-sectional view in a direction IIb in FIG. 1, and FIG. 2(c) a cross-sectional view in the direction IIa in FIG. 1 in a state where the brush has been withdrawn to the rear.
Figure 2:
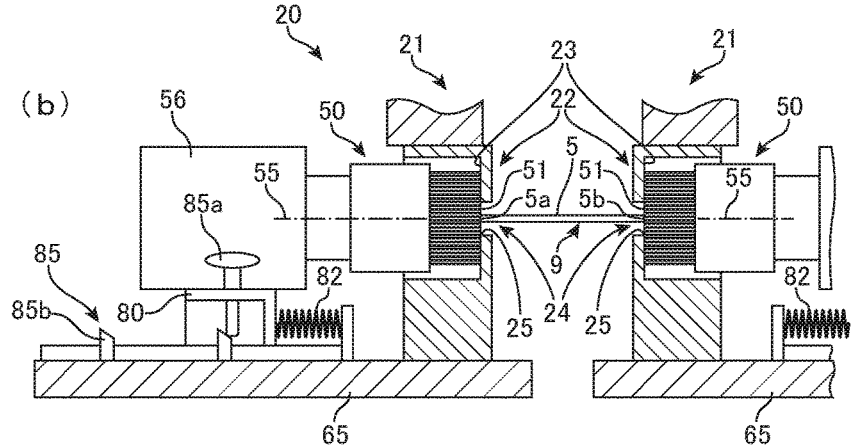
Figure 2:
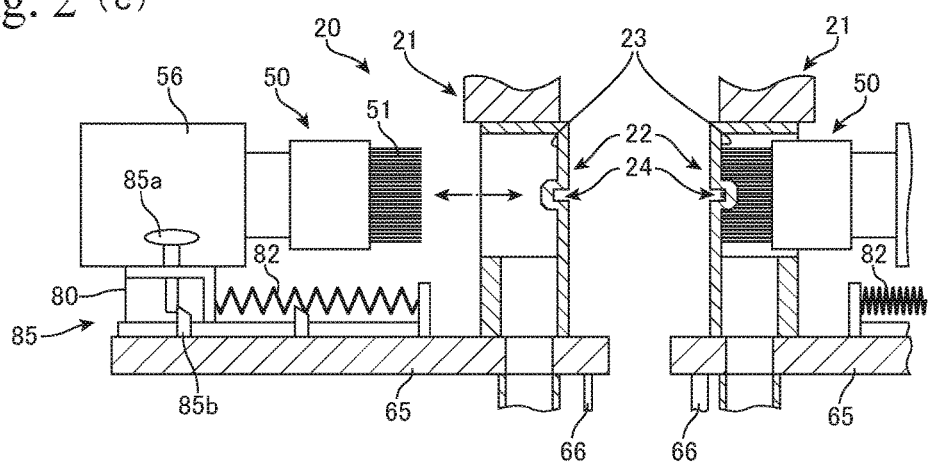
Figure 3:
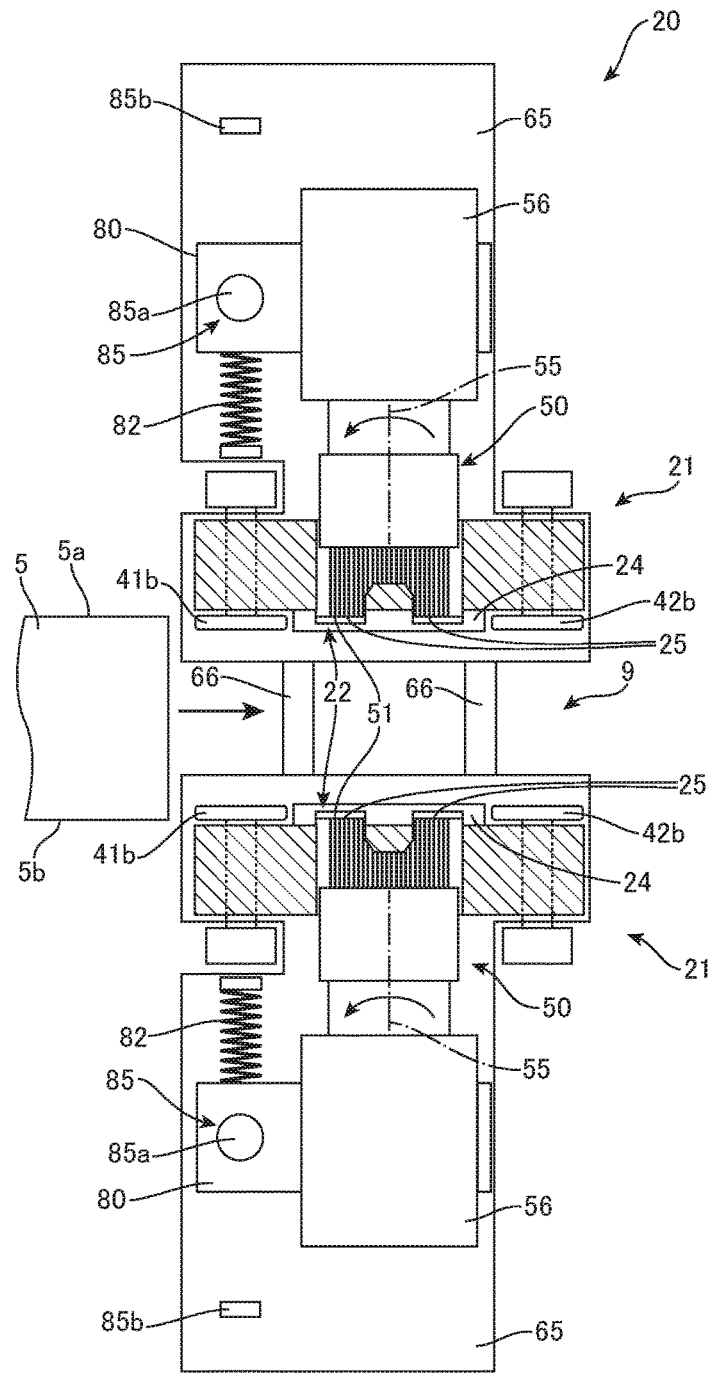
FIG. 3 is a plan view showing the configuration of the substrate cleaning apparatus along the path of a substrate.

FIG. 2 shows the configuration in the vicinity of the guide block 21 of the end surface cleaning apparatus 20 and the brush 50 by way of enlarged cross sections in the vertical direction. FIG. 3 shows the configuration of the end surface cleaning apparatus 20 along the path of the substrate 5 by way of a plan view. In the end surface cleaning apparatus 20, the pair of guide blocks 21 are disposed opposite one another (facing each other) so as to clean both end surfaces 5a and 5b of the substrate 5 that passes the conveying path, with a cleaning brush 50 being attached to each of the guide blocks 21. The end surface cleaning apparatus 20 further includes plates 65 that support the guide blocks 21 and the brushes 50 and a connecting mechanism 66 that is capable of adjusting the distance between the plates 65. Since the configuration is the same on the left and right sides of the end surface cleaning apparatus 20, the detailed configuration will be described mainly focusing on the guide block 21 shown on the left.

The end surface cleaning apparatus 20 includes the guide blocks 21, the brushes 50 attached to the guide blocks 21 respectively, motors 56 that rotate the brushes 50, support plates 80 that support the motors 56 and the brushes 50, springs (pressing unit) 82 that press the brushes 50 from the support plate 80 in the direction of the guide block 21, and a withdrawing unit 85 that fixes the support plate 80 at a position that is away from the guide block 21, all of which are disposed on or above the plate (table) 65. The pressing unit 82 is not limited to a spring and may be a mechanism that applies a different elastic force or a pressing mechanism such as an air cylinder.

As shown in FIGS. 2(a), 2(b), and 3, the substrate 5 is conveyed on a conveying path (movement path or path) 9 in the end surface cleaning apparatus 20 by the substrate conveying unit (conveyor unit) 40 including the rollers 41a, 41b, 42a, and 42b, with both end surfaces 5a and 5b of the conveyed substrate 5 passing through the channels 24 provided in the front surfaces 22 of the guide blocks 21 on both sides. The brushes 50 are inserted into the guide block 21 from the rear side and rotate about a center axis (rotational axis) 55 in a state where the brushes 50 are pressed by the springs 82 via the support plates 80 in the direction of the channels 24. The channels 24 include the openings 25 that extend through the walls on the front sides of the guide block 21, with the front ends 51 of the brushes 50 that protrude outward from the openings 25 in the direction of the substrate 5 contacting the pair of end surfaces 5a and 5b respectively while rotating to clean both end surfaces 5a and 5b of the substrate 5.

As shown in FIG. 2(c), when it is not necessary to clean the end surfaces 5a and 5b, the brushes 50 are escaped by the withdrawing units 85 on the support plates 80 to the rear side of the guide blocks 21. Each withdrawing unit 85 includes a pin 85a provided on the support plate 80 and a protrusion 85b provided on the table plate 65, and by having the pin 85a catch on the protrusion 85b at a position that is away from the guide block 21 on the table plate 65, it is possible to fix the support plate 80 at a position that is away from the guide block 21. In a state where the support plate 80 is away from the guide block 21, it is possible to replace a brush 50 and to change the type of the brush 50 in accordance with the type and/or state (such as soiling) of the substrate 5.

Figure 4:
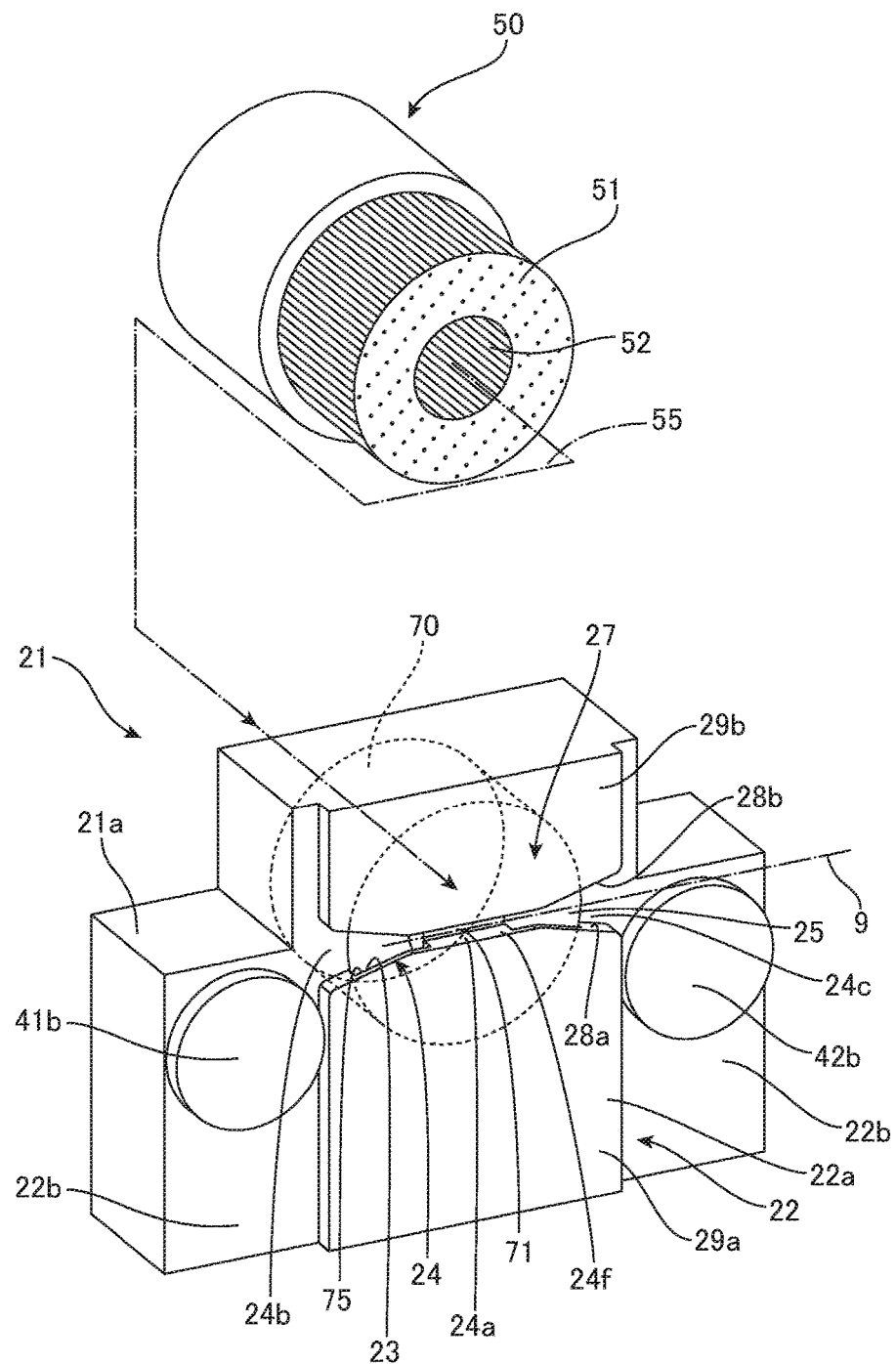
FIG. 4 is a perspective view showing the overall configuration of a lower block of the guide block.
Figure 5:
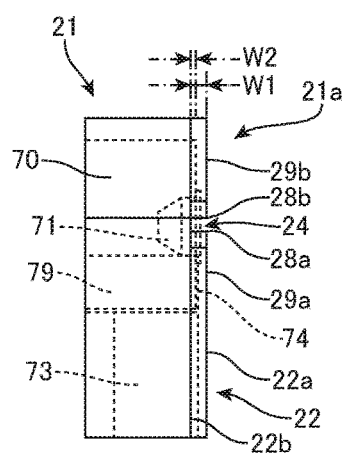
FIGS. 5(a)-(f) shows the configuration of a lower block, with FIG. 5(a) a front view, FIG. 5(b) a cross-sectional view in the horizontal direction, FIG. 5(c) a rear view, FIG. 5(d) a side view, FIG. 5(e) a cross-sectional view in the vertical direction, and FIG. 5(f) a cross-sectional view in the vertical direction at a position shifted from the center.
Figure 5:
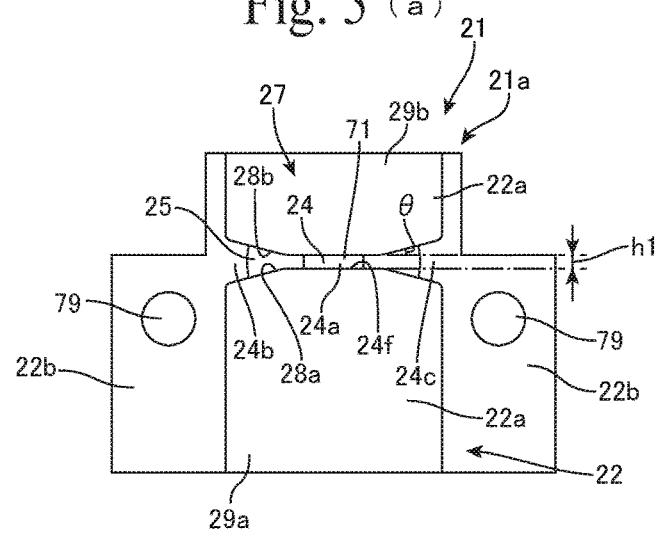
Figure 5:
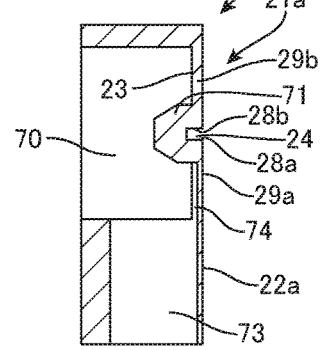
Figure 5:
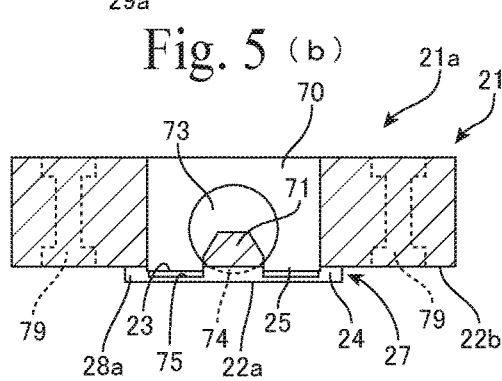
Figure 5:
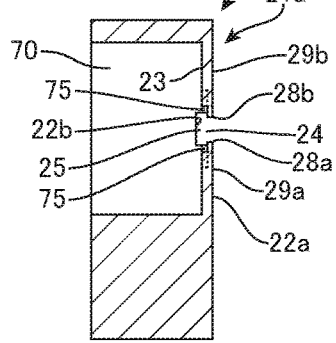
Figure 5:
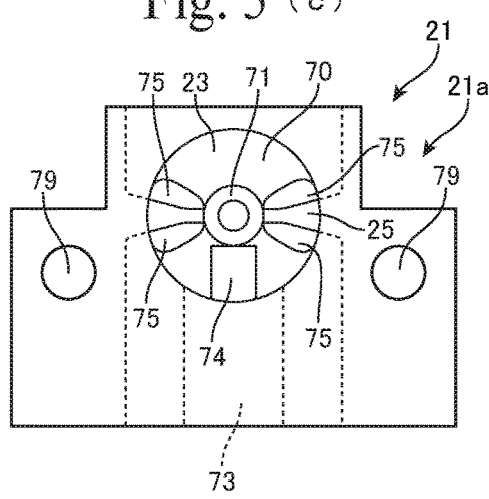

FIG. 4 shows, by way of a perspective view, the overall configuration of the lower block 21a of a guide block 21 which has been extracted. FIG. 5(a) is a front view of the lower block 21a, FIG. 5(b) is a cross-sectional view in the horizontal direction, FIG. 5(c) is a rear view, FIG. 5(d) is a side view, FIG. 5(e) is a cross-sectional view in the vertical direction, and FIG. 5(f) is a cross-sectional view in the vertical direction at a position shifted from the center.

The lower block 21a is a block with an overall inverted T shape, and a center part of the front surface (face-to-face side surface) 22 forms a guide portion 27 that protrudes in a direction (front direction face-to-face direction) of the path 9 of the substrate 5. The guide portion 27 includes guide walls 29a and 29b (the lower guide wall 29a and the upper guide wall 29b) that protrude so as to sandwich the path 9. An upper end 28a of the lower guide wall 29a and a lower end 28b of the upper guide wall 29b have a symmetrical shape on up and down sides to the path 9 on which the substrate 5 passes, and by the upper end 28a and the lower end 28b, the channel 24 along which the end portion (end surface) 5a of the substrate 5 passes is formed in the front surface (face-to-face surface) 22a of the guide portion 27. Both ends 24b and 24c (input side 24b and output side 24c) of the channels 24 widen in the up-down direction compared to the center 24a, and a flat part (horizontal part) 24f that extends along the direction of the path 9 is formed in the center 24a.

It is preferable for the width (height) h1 of the center 24a of the channel 24 to be around 2 to 6 mm, with around 2 to 4 mm more preferable. It is also preferable for the length of the flat part 24f of the center portion to be around 10 to 30 mm, with around 15 to 25 mm more preferable. In addition, it is desirable for both ends 24b and 24c to extend at an angle θ of 30 to 80° from the flat part 24f of the center portion, with an angle θ of 40 to 70° more desirable.

The upper guide wall 29b and the lower guide wall 29a are connected by a protrusion 71 that protrudes from the center part of the channel 24 in the direction of the rear surface (back surface) 23 of the guide portion 27. The guide walls 29a and 29b in the present embodiment are parts where the front surface 22 of the wall portion 21a protrudes outward and are integrated with the lower block 21a. A plate where the upper guide wall 29b and the lower guide wall 29a are integrated by the protrusion 71 that protrudes from the back surface can be provided as a unit of the guide portion 27, with this being attached to the guide block 21.

The rear side (back side) of the guide portion 27, that is, the rear side of the guide walls 29a and 29b of the lower block 21a forms a cylindrical concave portion 70, with a cleaning brush 50 being housed so that the front ends 51 contact the bottom surface of the concave portion 70, which is the rear surface 23 of the guide portion 27. The channel 24 that is formed by the guide walls 29a and 29b includes the openings 25 that extend through the guide portion 27 and are open to the concave portion 70. The front ends 51 of the brush 50 protrude inside the channel 24 from the openings 25 and contact and clean the end surface 5a of the substrate 5 passing along the channel 24. The openings 25 of the guide portion 27 are provided inside the cylindrical concave portion 70 in the same shape as the channel 24, except for the protrusion 71 on the center of the channel 24 that is protruded from the channel 24 to the rear side.

More specifically, out of the front surface 22 of the lower block 21a, the front surfaces 22a of the guide walls 29a and 29b of the guide portion 27 are protruded and form the upper surface (higher surface) of the height difference of the channel 24 through which the substrate 5 passes. The surface 22b of the other part of the front surface 22 of the lower block 21a forms the bottom surface (lower surface) of the height difference of the channel 24. The rear surfaces 23 of the guide walls 29a and 29b, which are contacted by the front ends 51 of the brush 50 and control the position of the front ends 51, are positioned closer to the path 9 of the substrate than the front surface 22b that forms the bottom surface of the channel 24. Therefore, the front ends 51 of the brush 50 protruding from the bottom surface 22b of the channel 24 toward the path 9. This means that the front ends 51 of the brush 50 contact the end surface 5a of the substrate 5 that passes through the channel 24 so as to clean the end surface 5a in a state where the position of the front ends 51 is controlled by the rear surfaces 23 of the guide walls 29a and 29b of the guide portion 27. In this example, although the channel 24 is formed so that the guide portion 27 protrudes forward compared to other parts of the lower block 21a, the shape and method of forming the channel 24 are not limited to this example. The channel 24 may be formed in the front surface of the lower block 21a or the lower block 21a may be formed by only the guide portion 27.

It is preferable for the width (the distance between the upper surface 22a and the lower surface 22b) W1 of the channel 24 to be around 1 to 5 mm, with around 2 to 4 mm more preferable. The distance W2 between the rear surface (back surface) 23 of the guide walls 29a and 29b and the lower surface 22b of the channel is preferably around 0.5 to 2 mm, with around 0.5 to 1.5 mm more preferable.

The lower block 21a also includes a suction hole 73 that is open to the lower surface of the concave portion 70. The suction hole 73 is connected to the suction hose 62 and dust that has been carried into the concave portion 70 by the brush 50 is discharged to the outside. In this example, the suction hole 73 extends downward from the rear surface 23 side of the concave portion 70. The brush 50 rotates in a direction that causes the substrate 5 in the channel 24 to be pressed downward and so prevents flapping of the front end of the substrate 5 inside the channel 24. Accordingly, dust that has been swept away by the brush 50 is first discharged downward and is then discharged through the suction hole 73. This means that it is possible to suppress reattachment of dust to the substrate 5.

The lower block 21a also includes a discharge channel 74 with a depth of around 0.5 to 2 mm that extends in the radial direction on the rear surface (back surface) 23 of the guide portion 27 that is the bottom surface of the cylindrical concave portion 70, and the discharge channel 74 is connected to the suction hole 73. The front ends 51 of the brush 50 rotate while contacting the rear surface 23 of the guide portion 27 and on reaching the discharge channel 74, the front ends 51 become free inside the discharge channel 74 so that dust adhering to the front ends 51 is released to the discharge channel 74. Since it is common for a brush with strong bristles to be used to clean the end surfaces, it is easy for the dust to be released when the front ends 51 become free in the discharge channel 74 from the state where the front ends 51 contacted the rear surface 23. Since the discharge channel 74 is connected to the suction hole 74 and be tend to negative pressure, the released dust in the discharge channel 74 is immediately collected.

The lower block 21a also includes depressions 75 with a depth W3 of around 0.5 to 2 mm that extend in the up-down side of the openings 25 of the rear surface 23 that is the bottom surface of the cylindrical concave portion 70. The front ends 51 of the brush 50 rotate while contacting the rear surface 23 of the guide portion 27, and on reaching the depressions 75, the front ends 51 become tend to free so that the front ends 51 protrude toward the substrate 5 from the openings 25 that extend through the guide portion 27. Accordingly, the front ends 51 of the brush 50 contact the end surface 5a of the substrate 5 in a state where the front ends 51 protrude (extend) substantially vertically, which makes it easy to remove dust from the substrate 5. The front ends 51 of the brush 50 also rotate in a state where the guide portion 27 is not contacted or is hardly contacted before and after the openings 25. This makes it difficult for dust that adheres to the front ends 51 of the brush 50 to become reattached and the dust that has been swept away by the brush 50 is easy to collect.

The lower block 21a further includes through-holes 79 for inserting drive shafts (not shown) that support the lower rollers 41b and 42b and drive the lower rollers 41b and 42b from the back side of the lower block 21a.

The brush 50 that is attached to the cylindrical concave portion 70 of the lower block 21a is a rotating circular type brush as shown in FIG. 4 and is set so that the rotational axis 55 is perpendicular to the rear surface 23 of the guide portion 27 that forms the bottom surface of the concave portion 70. The front ends 51 of the brush 50 are composed of a countless number of bristles made of resin such as nylon or acrylic, and are gathered together in the overall form of a cylinder. A center part 52 of the front ends 51 is formed as a hollow and by positioning the center part 52 at the protrusion 71 that protrudes to the rear from the bottom surface (rear surface) 23 of the concave portion 70, the protrusion 71 acts as a support portion that extends in the direction of the rotational axis 55 of the brush 50. As a result, the brush 50 rotates in a more stable state inside the concave portion 70.

In this example, the protrusion 71 is provided at a position corresponding to a center portion of the channel 24 where the substrate 5 passes and the brush 50 rotates so as to be centered on the level of the end surface 5a of the substrate 5. Accordingly, the front ends 51 of the brush 50 come into contact with the end surface 5a of the substrate 5 in different directions in the up-down direction at the opening 25 on the entry side of the channel 24 and the opening 25 on the discharge side, so that the end surface 5a of the substrate 5 is cleaned from both above and below. As described earlier, to suppress flapping of the front end of the substrate 5, it is desirable for the brush 50 to rotate so that the front ends 51 of the brush 50 contact the substrate 5 from above to below at the opening 25 on the entry side. This means that at the opening 25 on the discharge side of the substrate 5, the front ends 51 of the brush 50 rotate so as to contact the end surface 5a from below to above. The rotational axis 55 of the brush 50 may be shifted from the center of the channel 24 in the front-rear and up-down directions.

Figure 6:
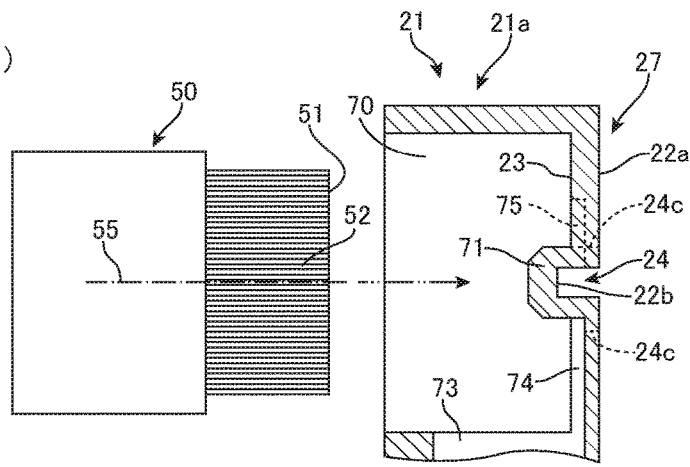
FIGS. 6 (a)-(c) are cross-sectional views showing how the brush is set on the guide portion of the guide unit and cleans the end surface of the substrate, with FIG. 6(a) showing how the brush is set in a concave portion of the guide portion, FIG. 6(b) showing how the front ends of the brush are set in a concave portion, and FIG. 6(c) showing how the end surface of a substrate is cleaned.
Figure 6:
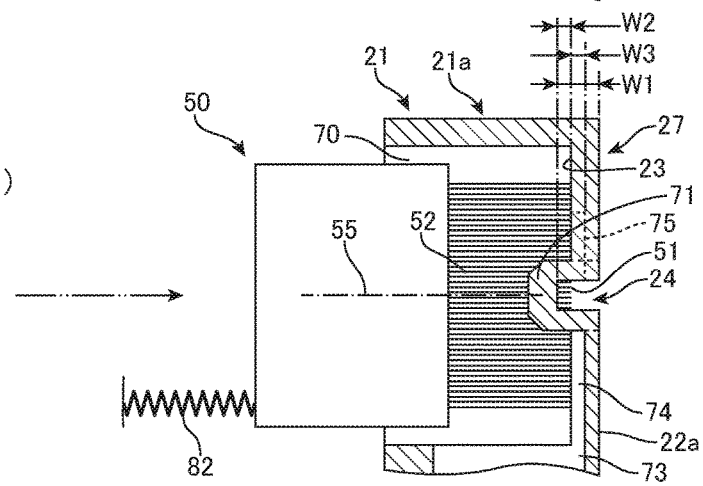
Figure 6:
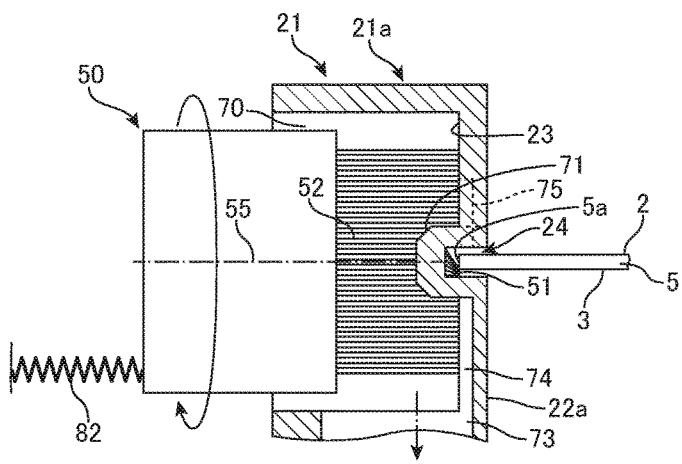

FIG. 6 shows, by way of an enlargement, how the brush 50 is set on the guide portion 27 of the guide block 21 and cleans the end surface 5a of the substrate 5. As shown in FIG. 6(a), the channel 24, through which the end surfaces 5a of the substrate 5 pass, is provided in the front surface 22a of the guide portion 27 and the cylindrical concave portion 70, in which the front ends 51 of the brush 50 are housed, is provided on the rear of the guide portion 27. As shown in FIG. 6(b), when the front ends 51 of the brush 50 are set in the concave portion 70, the front ends 51 contact the rear wall (rear surface) 23 of the guide portion 27 and the front ends 51 protrude into the channel 24 in a state where the position of the front ends 51 is controlled. As shown in FIG. 6(c), the brush 50 rotates and cleans the end surface 5a of the substrate 5 that passes through the channel 24.

The brush 50 is pressed toward the rear wall 23 by the spring 82, so that even if the length of the brush 50 changes due to abrasion caused by cleaning, a certain amount of contact will still be maintained. To do so, the position of the brush 50 is controlled so that the abraded front ends 51 contact the rear wall 23 and the brush 50 rotates in a state where the front ends 51 of the brush 50 protrude inside the channel 24 by a predetermined length to clean the end surface 5a of the substrate 5.

The contact position of the front ends 51 of the brush 50 with the rear wall 23 of the guide portion 27 is precisely controlled. This means that it is possible to precisely control the amount (length) by which the front ends 51 protrude into the channel 24 and since the position of the front ends 51 is mechanically decided, the length and position of the contact between the front ends 51 of the brush 50 and the substrate 5 are extremely precise and highly reliable. This means that there is hardly any risk of damage to the substrate 5 and of damage to the circuits and circuit components on the substrate 5, even when a brush 50 with hard bristles is used. Since the position of the front ends 51 is controlled by the front ends 51 contacting the rear wall 23, by using a brush 50 with hard bristles, the positional precision of the front ends 51 is improved. This means that in the end surface cleaning apparatus 20, by using a hard brush 50, in addition to dust, it is also possible to remove burrs produced when cutting the substrate or the like.

In addition, the protrusion 71 that protrudes to the rear from the center of the rear surface 23, that is, from the channel 24 is provided on the concave portion 70, and the center part (central part) 52 of the circular brush 50 is hollow so that the protrusion 71 can be inserted. Accordingly, the front ends 51 of the brush 50 rotate with the center part 52 guided by the protrusion 71. This means that the brush 50, including the front ends 51, stably rotates about the rotational axis 55. Accordingly, it is possible to further reduce the risk of damage to the substrate 5.

The depressions 75 with the width W3 are provided in the up-down direction in the openings 25 of the rear surface 23, so that the front ends (bristle tips) 51 become freed and contact the end surface 5a of the substrate 5 in an upright state. Accordingly, it is possible to clean by sweeping the end surface 5a of the front ends 51 and possible to improve the efficiency of dust removal. It is desirable for the width W3 of the depressions 75 to be equal to the width of the length W2 by which the front ends 51 protrude into the channel 24.

The suction channel (discharge channel) 74 and the suction hole 73 that are connected to the suction channel 74 are provided in the concave portion 70 in which the front ends 51 of the brush 50 are housed. Accordingly, it is possible to discharge the dust swept away by the brush 50 from the concave portion 70 by this suction mechanism and to suppress reattachment to the substrate 5. Also, even if dust becomes reattached to the front surface 2 or the back surface 3 of the substrate 5, it is possible to remove such dust by the two-face cleaning apparatus 30 disposed downstream of the end surface cleaning apparatus 20. Accordingly, it is desirable for the end surface cleaning apparatus 20 to be disposed upstream of the two-sided cleaning apparatus 30.

Figure 7:
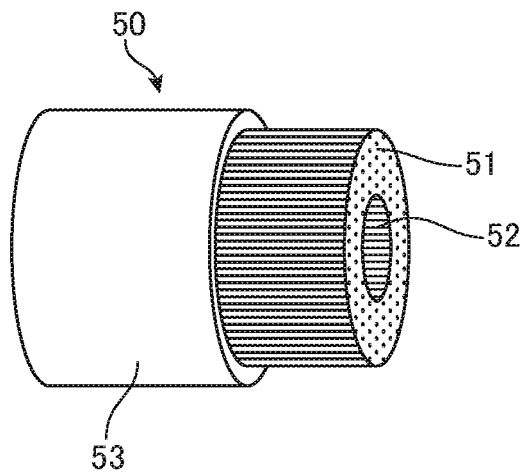
FIGS. 7 (a)-(b) shows different examples of brushes, with FIG. 7(a) showing a brush where the front ends are fixed by bonding to a main body and FIG. 7(b) showing a brush where the front ends are embedded in the main body.
Figure 7:
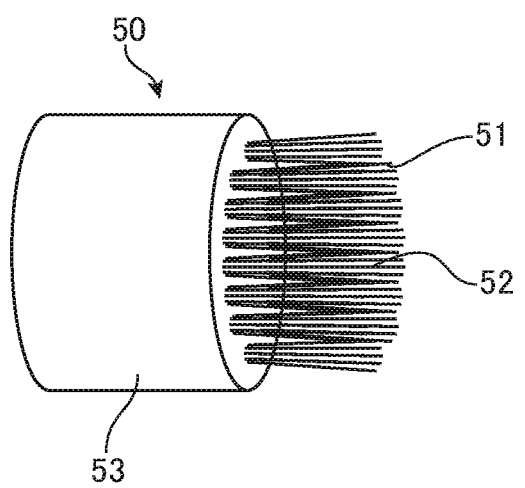

FIG. 7 shows a number of different examples of brushes 50 that can be attached to the end surface cleaning apparatus 20. The brush 50 may have the front ends (bristle part) 51 fixed by bonding to a main body 53 as shown in FIG. 7(a), or may have the front ends 51 embedded in the main body 53 as shown in FIG. 7(b). The material of the front ends 51 may be a hard material with a high strength, such as a wire brush, or may be a soft material, such as hair or cloth. As shown in FIG. 2(c), replacement of the brush 50 can be carried out easily in a state where the brush 50 has been withdrawn. End surface cleaning apparatuses 20 that are equipped with brushes of different strengths or hardnesses may also be disposed in order in the conveying direction of the substrate 5 to clean the end surfaces of substrates.

As described above, the substrate cleaning apparatus 10 includes the end surface cleaning apparatus 20 upstream of the two-sided (two-face) cleaning apparatus 30 that cleans both main surfaces of the substrate 5 that is being conveyed. Accordingly, while conveying the substrate 5, it is possible to remove dust on both end surfaces (side surfaces) 5a and 5b in addition to both main surfaces of the substrate 5.

Note that although the end surface cleaning apparatus 20 incorporated in the substrate cleaning apparatus 10 has been described above as an example, it is also simple to provide the end surface cleaning apparatus 20 as a unit that has the guide blocks 21 and a conveying unit with a plurality of rollers, brushes 50, and the like and to retrofit such unit to existing equipment, such as a conveyor, that conveys substrates.

The invention claimed is:

1. An apparatus comprising:
a guide unit including a guide portion that has a channel, through which an end surface of a substrate passes, formed in a front surface thereof; and
a brush with a front end whose position is controlled by the front end contacting a rear surface of the guide portion,
wherein the channel includes an opening that extends through the guide portion and the front end of the brush contacts an end surface of a substrate passing through the channel via the opening.

2. The apparatus according to claim 1,
wherein the guide unit includes:
a concave portion in which at least the front end of the brush is housed; and
a suction hole that sucks dust from the concave portion.

3. The apparatus according to claim 2,
wherein the guide unit includes a channel that connects to the suction hole on the rear surface of the guide portion inside the concave portion.

4. The apparatus according to claim 1,
wherein the brush has a rotational axis that is perpendicular to the rear surface of the guide portion.

5. The apparatus according to claim 4,
wherein the guide unit includes a support portion that protrudes in a direction of the rotational axis from the channel of the guide portion through which an end portion of a substrate passes, wherein the brush rotates around the rotational axis in a state where the support portion is inserted into a depressed part in a center part on the front end side of the brush.

6. The apparatus according to claim 4,
wherein the brush is a rotating circular type brush.

7. The apparatus according to claim 1, further comprising:
a unit that presses the brush toward the rear surface of the guide portion; and
a unit that fixes a position of the brush in a state where the front end of the brush is away from the rear surface of the guide portion alternatively.

8. The apparatus according to claim 1, further comprising:
a plurality of the guide units disposed so that the channels in the front surfaces face one another at a position where a pair of end surfaces of a substrate pass the channels respectively; and
a plurality of brushes disposed so that positions of the front ends are controlled by the rear surfaces of the guide portions of the plurality of guide units respectively.

9. The apparatus according to claim 8, further comprising a unit that conveys a substrate so that a pair of ends of the substrate pass through the channels respectively in the front surfaces of the guide portions of the plurality of guide units.

* * * * *

UNITED STATES PATENT AND TRADEMARK OFFICE
CERTIFICATE OF CORRECTION

PATENT NO. : 9,889,473 B2
APPLICATION NO. : 14/954392
DATED : February 13, 2018
INVENTOR(S) : Soichi Yanagisawa It is certified that error appears in the above-identified patent and that said Letters Patent is hereby corrected as shown below:

On the Title Page

Item (73) Assignee:
Change "Nagaoka Seisakucho Corp. (JP)" to --Nagaoka Seisakusho Corp. (JP)--.

Signed and Sealed this
Twenty-sixth Day of June, 2018

Andrei Iancu
*Director of the United States Patent and Trademark Office*